United States Patent
Eickelmann et al.

(10) Patent No.: US 9,455,361 B2
(45) Date of Patent: Sep. 27, 2016

(54) SEGMENTED THIN FILM SOLAR CELLS

(71) Applicant: GLOBALFOUNDRIES INC., Grand Cayman (KY)

(72) Inventors: Hans-Juergen Eickelmann, Nieder-Hilbersheim (DE); Ruediger Kellmann, Mainz (DE); Markus Schmidt, Seibersbach (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 156 days.

(21) Appl. No.: 14/165,607

(22) Filed: Jan. 28, 2014

(65) Prior Publication Data

US 2015/0024542 A1    Jan. 22, 2015

Related U.S. Application Data

(63) Continuation of application No. 13/947,205, filed on Jul. 22, 2013.

(51) Int. Cl.
| | |
|---|---|
| *H01L 31/18* | (2006.01) |
| *H01L 31/05* | (2014.01) |
| *H01L 31/0392* | (2006.01) |
| *H01L 31/0463* | (2014.01) |

(52) U.S. Cl.
CPC ....... *H01L 31/0508* (2013.01); *H01L 31/0392* (2013.01); *H01L 31/03923* (2013.01); *H01L 31/03925* (2013.01); *H01L 31/0463* (2014.12); *Y02E 10/541* (2013.01); *Y02P 70/521* (2015.11)

(58) Field of Classification Search
CPC .......... H01L 31/0508; H01L 31/0392; H01L 31/03925; H01L 31/0463; H01L 31/03923
See application file for complete search history.

(56) References Cited

U.S. PATENT DOCUMENTS

| | | | | |
|---|---|---|---|---|
| 4,773,942 A | * | 9/1988 | Hamakawa | ....... H01L 31/03921 136/244 |
| 6,168,968 B1 | * | 1/2001 | Umemoto | .......... B23K 26/0732 136/244 |

(Continued)

FOREIGN PATENT DOCUMENTS

| | | |
|---|---|---|
| WO | 2008051275 A2 | 5/2008 |
| WO | 2010085467 A1 | 7/2010 |

OTHER PUBLICATIONS

Hendel, "Laser Processing of Solar Cells", 24th European Photovoltaic Solar Energy Conference and Exhibition IPVEA Workshop, Sep. 21-25, 2009, Hamburg, Germany, Copyright ROFIN, pp. 1-29.

(Continued)

*Primary Examiner* — Golam Mowla
(74) *Attorney, Agent, or Firm* — Scully Scott Murphy and Presser

(57) ABSTRACT

Use of chemical mechanical polishing (CMP) and/or pure mechanical polishing to separate sub-cells in a thin film solar cell. In one embodiment the CMP is only used to separate the active, thin film layer into sub-cells, with scribing still being used to achieve sub-cell separation in conductive layers above and below the active, thin film layer. Also, the active layer may be placed over a series of protrusions so that the CMP removes the active layer that is over the protrusion, while leaving intact the flat, planar portions of the active layer. In this way, the removed active layer, from over the protrusions then becomes the division between sub-cells in the active layer.

3 Claims, 2 Drawing Sheets

(56) References Cited

U.S. PATENT DOCUMENTS

| | | | |
|---|---|---|---|
| 6,184,057 B1* | 2/2001 | Van Andel | H01L 31/022466 136/244 |
| 6,222,115 B1* | 4/2001 | Nakanishi | H01L 31/048 136/244 |
| 6,350,945 B1* | 2/2002 | Mizuno | H01L 31/0465 136/246 |
| 6,521,823 B2* | 2/2003 | Kubota | H01L 31/048 136/244 |
| 7,238,878 B2* | 7/2007 | Gonsiorawski | B32B 17/1033 136/244 |
| 7,259,321 B2* | 8/2007 | Oswald | H01L 31/18 136/244 |
| 7,927,497 B2* | 4/2011 | Lim | H01L 31/022466 136/252 |
| 8,105,868 B2 | 1/2012 | Winkeler et al. | |
| 8,197,912 B2 | 6/2012 | Krause et al. | |
| 8,294,026 B2 | 10/2012 | Wang et al. | |
| 8,445,775 B2* | 5/2013 | Shinohara | H01L 31/022425 136/244 |
| 2001/0037823 A1 | 11/2001 | Middelman et al. | |
| 2002/0167070 A1* | 11/2002 | Prendergast | H01L 21/02381 257/613 |
| 2003/0041893 A1* | 3/2003 | Shimakawa | H01L 31/022425 136/244 |
| 2004/0035460 A1* | 2/2004 | Gonsiorawski | B32B 17/1033 136/251 |
| 2004/0109666 A1* | 6/2004 | Kim | F24J 2/067 385/147 |
| 2004/0187916 A1* | 9/2004 | Hezel | H01L 31/022425 136/256 |
| 2004/0266147 A1* | 12/2004 | Shimomura | H01L 21/2022 438/488 |
| 2005/0170981 A1* | 8/2005 | Mun | C11D 1/146 510/201 |
| 2005/0236037 A1* | 10/2005 | Ahn | H01G 9/2081 136/263 |
| 2005/0274408 A1 | 12/2005 | Li et al. | |
| 2006/0207647 A1* | 9/2006 | Tsakalakos | B82Y 20/00 136/256 |
| 2007/0163646 A1* | 7/2007 | Kushiya | H01L 31/022425 136/264 |
| 2007/0169807 A1* | 7/2007 | Nakashima | H01L 31/022466 136/256 |
| 2007/0204902 A1* | 9/2007 | Dutta | H01L 31/035281 136/256 |
| 2008/0202585 A1* | 8/2008 | Yamanaka | H01G 9/2031 136/263 |
| 2008/0236662 A1* | 10/2008 | Ichikawa | H01G 9/2068 136/256 |
| 2008/0251126 A1* | 10/2008 | Yamazaki | H01L 31/0392 136/261 |
| 2008/0308155 A1* | 12/2008 | Fukui | H01G 9/2031 136/261 |
| 2009/0308429 A1 | 12/2009 | Walsh et al. | |
| 2010/0012166 A1* | 1/2010 | Yamanaka | H01G 9/2031 136/244 |
| 2010/0024875 A1* | 2/2010 | Fukui | H01G 9/2068 136/256 |
| 2010/0071743 A1* | 3/2010 | Yamanaka | H01G 9/2081 136/244 |
| 2010/0078055 A1* | 4/2010 | Vidu | B82Y 10/00 136/244 |
| 2010/0078060 A1* | 4/2010 | Okada | H01G 9/2081 136/244 |
| 2010/0116311 A1* | 5/2010 | Fukui | H01G 9/2081 136/244 |
| 2011/0041890 A1* | 2/2011 | Sheats | H01L 31/022433 136/244 |
| 2011/0094561 A1* | 4/2011 | Fukui | H01G 9/2022 136/244 |
| 2011/0100432 A1* | 5/2011 | Wang | H01L 31/18 136/249 |
| 2011/0111076 A1 | 5/2011 | Fork et al. | |
| 2012/0199178 A1 | 8/2012 | Wagner et al. | |
| 2012/0234375 A1 | 9/2012 | Nakamura et al. | |
| 2012/0298187 A1* | 11/2012 | Kim | H01G 9/2081 136/251 |
| 2012/0305054 A1* | 12/2012 | Kim | H01G 9/2077 136/251 |

OTHER PUBLICATIONS

Rekow, et al., "CIGS P1, P2, P3 Scribing Processes using a Pulse Programmable Industrial Fiber Laser", Presented at the 25th European PVSEC/WCPEC-5 Valencia, Spain, Sep. 6-10, 2010, NREL National Renewable Energy Laboratory, Conference Paper NREL/CP-5200-49411, Oct. 2010.

"Inside CIGS Solar Panels", CS Compound Semiconductor, Sep. 23, 2010, <http://compoundsemiconductor.net/csc/features-details/19732466/Inside-CIGS-Solar-Panel.html>.

U.S. Appl. No. 13/947,205, entitled "Segmented Thin Film Solar Cells", filed Jul. 22, 2013.

U.S. Office Action dated Jan. 25, 2016 from related U.S. Appl. No. 13/947,205, filed Jul. 22, 2013.

U.S. Office Action dated May 24, 2016 from related U.S. Appl. No. 13/947,205 tiled on Jul. 22, 2013.

* cited by examiner

SEGMENTED THIN FILM SOLAR CELLS

CROSS REFERENCE TO RELATED APPLICATIONS

This application claims priority to co-pending U.S. patent application Ser. No. 13/947,205, filed Jul. 22, 2013.

FIELD OF THE INVENTION

The present invention relates generally to the field of thin film cells that transduce electromagnetic radiation into electrical energy (herein generically called e/m radiation cells), more particularly to thin film solar cells.

BACKGROUND OF THE INVENTION

Two known types of solar cells are: (i) thin film solar cells; and (ii) crystalline solar cells. This document deals with thin film solar cells, and does not deal with crystalline solar cells. Thin film solar cells are segmented into sub-cells in order to optimize cell performance in terms of voltage and current. The segments are reconnected again, preferably in a monolithic way (where the electrical connections are created in situ) without further added interconnection wiring. The segmentation is currently done by: (i) mechanical scribing; or (ii) laser evaporation (also called laser scribing). The conventional process for thin film solar cell segmentation includes the following scribe operations: (i) deposit and scribe into sub-cell formations the conducting back contact layer (also called the "lower conducting layer"); (ii) deposit and scribe into sub-cell formations the absorber (that is, the active layer); (iii) deposit and scribe into sub-cell formations the transparent conducting oxide (also called the "upper conducting layer"); and (iv) edge scribe.

Thin film solar cells are expected to deliver substantial cost savings compared to first generation bulk crystalline solar cells. They are manufactured by large area deposition of thin films. For practical purposes, the module voltage has to be increased by a series connection of several sub-cells. In order to take advantage of monolithic integration, the scribing processes, mentioned in the previous paragraph, are used to mechanically separate, while maintaining electrical connections between, respective sub-cell areas from each other.

SUMMARY

According to an aspect of the present invention, there is a process for at least partially making an electromagnetic radiation cell. The process includes the following actions (not necessarily in the following order): (i) providing a first intermediate state electromagnetic radiation cell sub-assembly that includes an active layer of a thin film type; and (ii) performing polishing on the first intermediate state electromagnetic radiation cell sub-assembly to remove at least a portion of the active layer to yield a second intermediate state electromagnetic radiation cell sub-assembly.

According to a further aspect of the present invention, there is a process for at least partially making a photovoltaic cell. The process includes the following actions (not necessarily in the following order): (i) providing a first intermediate state photovoltaic cell sub-assembly; (ii) performing polishing on the first intermediate state photovoltaic cell sub-assembly to yield a second intermediate state photovoltaic cell sub-assembly; and (iii) depositing an upper conductive layer on the second intermediate state photovoltaic cell sub-assembly to yield a third intermediate state photovoltaic cell sub-assembly. The first intermediate state thin film electromagnetic cell sub-assembly includes a substrate layer, a lower conductive layer on top of the substrate layer and a photovoltaic layer of a thin film type on top of the lower conductive layer. The performing of the polishing removes a portion of the photovoltaic layer so that the photovoltaic layer is divided into a plurality of mutually isolated sub-cells.

According to a further aspect of the present invention, an electromagnetic radiation cell includes: a substrate; and an active layer. The substrate includes an upper surface having a set of protrusions including at least one protrusion. The active layer is of a thin film type. The active layer is divided into a plurality of mutually isolated sub-cells. The divisions between the sub-cells are located over the protrusions in the substrate.

DETAILED DESCRIPTION

The present invention recognizes that the scribing processes conventionally used to make the sub-cell structures of thin film e/m radiation cells are not ideal, and can potentially reduce system performance through scribing-induced defects. The present disclosure further recognizes that: (i) conventional processes for making thin film solar cells are potentially detrimental to performance because they usually induce defect in the active semiconducting layers of the thin film solar cell; and (ii) the mechanical scribe step of the conventional process limits the spacing distance of scribes, resulting in a large dead area in between adjacent sub-cells of the thin film solar cell. This Detailed Description section is divided into the following sub-sections: (i) Operation of Embodiment(s) of the Present Invention; (ii) Further Comments and/or Embodiments; and (iii) Definitions.

I. Operation of Embodiment(s) of the Present Invention

Figure 2:
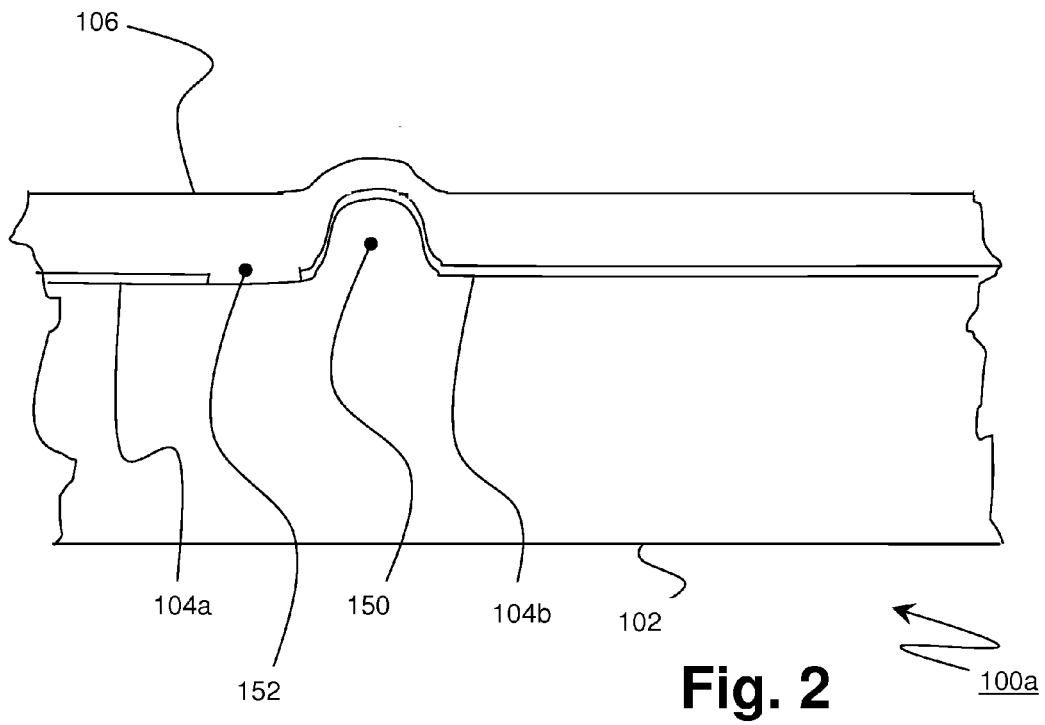
FIG. 2 is a transverse cross-sectional view (cross hatching omitted for clarity of illustration reasons) of a solar cell at an intermediate stage of manufacture according to the first manufacturing process.
Figure 3:
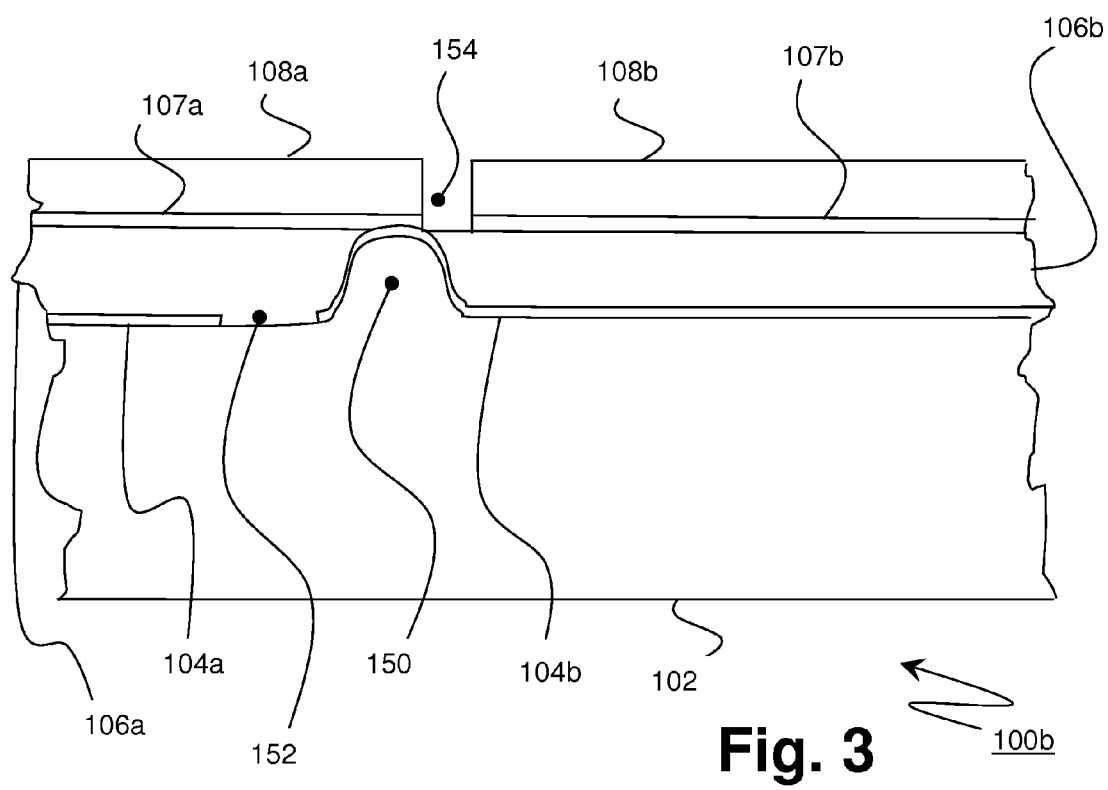
FIG. 3 is a transverse cross-sectional view (cross hatching omitted for clarity of illustration reasons) of a solar cell after completion of the first manufacturing process.

A process embodiment 50 of the present disclosure will now be discussed with reference to FIGS. 1-3. It is noted that the cross-sections of FIGS. 2 and 3 are not necessarily to scale.

Figure 1:
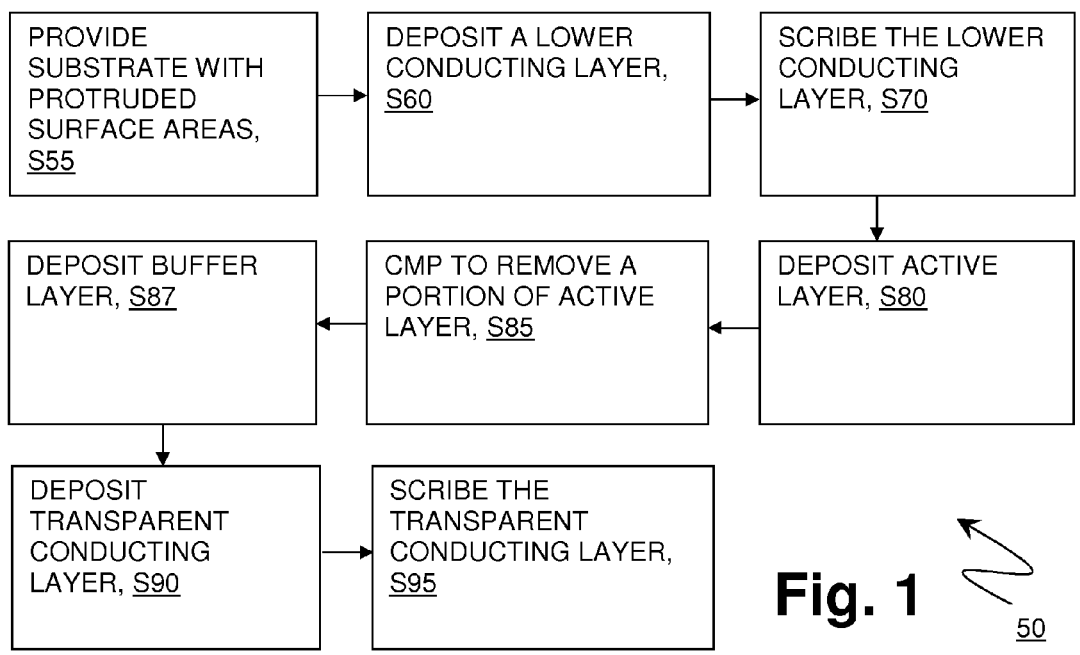
FIG. 1 is a flowchart view of a first manufacturing process according to the present disclosure.

As shown in FIG. 1, processing begins at step S55 where a substrate (for example, glass substrate, polymeric substrate, steel with barrier layer) is provided as starting stock for process 50. The starting stock substrate (not shown in the Figures) has protruding areas on its top surface area. For example, the protruding surface areas may be in the shape of stripes corresponding to the location of planned divisions between the sub-cells of the final product. For glass substrates, the protrusions may be made by: (i) chemical etching; (ii) hot embossing; or (iii) a combination of (i) and (ii). For polymeric substrates, protrusions may be made by: (i) hot embossing; (ii) steel embossing; or (iii) a combination of (i) and (ii).

Processing proceeds to step S60 where a deposition device deposits a lower conducting layer on the top surface of the substrate, including over the protruding areas mentioned above in connection with step S55. The lower conducting layer may be any material suitable for a lower conducting layer in a thin film e/m radiation cell, now conventional or to be developed in the future. In some embodiments, it may be preferable to use a material that is resistant to CMP (or at least some types of CMP) so that CMP material removal of the active layer (to be discussed below in connection with step S85) does not impact the geometry of the lower conducting layer. The conducting layer may be made of any metal capable of forming a good ohmic contact to the active layer (for example, Ag, Al or Mo).

Processing proceeds to step S70 where a scribing device (not shown in the Figures) scribes the lower conducting layer in order to separate the lower conducting layer into sub-cell structures. This step may be accomplished by any appropriate type of scribing now known or to be developed in the future. Alternatively, other material removal processes could be used to break the lower conducting layer into multiple sub-cell structures.

Processing proceeds to step S80 where a deposition device (not shown in the Figures) deposits an absorber layer (also sometimes referred to as an active layer).

FIG. 2 shows solar cell 100 in its intermediate sub-assembly state 100a, which occurs just after step S80 of process 50 has been completed. Intermediate state solar cell 100a includes: substrate 102 (including protruding area 150); first sub-cell portion 104a of lower conducting layer 104; second sub-cell portion 104b of conducting layer 104; active layer 106; and first scribed gap 152 in the lower conducting layer. Protruding area 150 was discussed above in connection with step S55. First scribed gap 152 was formed by the scribing discussed, above, in connection with step S70. Note that protruding area 150 causes a discontinuity in the lower surface of active layer 106. More specifically, the lower surface of active layer is generally flat and planar, except the portion of the active layer that is over protrusion which is a discontinuity in the shape of a recess in the lower surface of the active layer.

Processing proceeds to step S85 where a CMP device (not shown in the Figures) performs CMP on the top surface of intermediate state solar cell 100a. This CMP removes part, but not all, of active layer 106 in a top downwards manner. More specifically, the CMP removes a portion of the active layer from the initial top surface down to the level of its lower surface where the discontinuity caused by protrusion 150 is. Because the CMP removes material all the way down to the lower surface in the vicinity of the discontinuity in the lower surface, this means that the active surface is completely gone over the topmost portion of protrusion 150. On the other hand, in areas where the lower surface of the active layer is flat and planar, there is still plenty of active layer remaining over these portions, despite the material removal accomplished by the CMP. These remaining portions of active layer become sub-cells, but the completely removed portions of active layer are now breaks between sub-cells that electrically isolate the sub-cells from each other. It is the discontinuity in the lower surface of the active layer that causes these "breaks" in the active layer to occur.

Any type of CMP, now known, or to be developed in the future, may be used. In at least some embodiments of the present disclosure, the CMP of step S85 does not adversely affect the radiation-to-electricity transduction functionality of the remaining portion of active layer 106, which is advantageous from the perspective of solar cell performance. Alternatively, the material removal of step S85 can be accomplished by pure mechanical polishing, as an alternative to CMP. The CMP of step S85 has to be selective by not removing the bottom conductive layer, while reliably removing the active layer material. The chemical agent for the CMP of step S85 contains a mixture of acidic oxidizing and stabilizing agents.

Processing proceeds to step S87 where a deposition device (not shown in the Figures) deposits a buffer layer on top of the remaining portion of the active layer.

Processing proceeds to step S90 where a deposition device (not shown in the Figures) deposits a transparent conducting layer (also called an upper conducting layer) on top of the remaining portion of the buffer layer deposited at step S87. The upper conducting layer (see definition of "layer," below, in the definitions sub-section) includes a buffer sub-layer and a transparent front contact layer.

The upper conducting layer, or its constituent sub-layers, may be any materials suitable for a lower conducting layer in a thin film e/m radiation cell, now conventional or to be developed in the future. In order to be suitable for use as an upper conducting layer, the material and/or thickness of the upper conducting layer must be chosen so that the upper conducting layer is at least somewhat transmissive with respect to the wavelengths of e/m radiation that the active layer is designed to transduce into electricity. In some embodiments, it may be preferable to use a material for the upper conducting layer that can be easily removed by CMP (or at least some types of CMP) so that a CMP process can be used to divide the upper conducting layer into sub-cell structures. However, it should be understood that process 50, shown in FIG. 3, does not use CMP to divide the upper conducting layer into sub-cell structures. In this embodiment, the upper conducting layer is made of a doped transparent conducting oxide such as indium tin oxide (ITO), or aluminum doped zinc oxide (ZnO:Al).

Processing proceeds to step S95 where a scribing device (not shown in the Figures) scribes the upper conducting layer in order to separate the upper conducting layer into sub-cell structures. This step may be accomplished by any appropriate type of scribing now known or to be developed in the future. Alternatively, other material removal processes could be used to break the lower conducting layer into multiple sub-cell structures.

FIG. 3 shows solar cell 100 in its final state 100b, which occurs when process 50 has been completed. Final state solar cell 100b includes: substrate 102 (including protruding area 150); first sub-cell portion 104a of lower conducting layer 104; second sub-cell portion 104b of conducting layer 104; first scribed gap 152; first sub-cell portion 106a of active layer 106; second sub-cell portion 106b of active layer 106; second scribed gap 154; first sub-cell portion 107a of buffer sub-layer 107; second sub-cell portion 107b of buffer sub-layer 107; first sub-cell portion 108a of transparent contact sub-layer 108; second sub-cell portion 108b of transparent contact sub-layer 108. Taken together, sub-layers 107 and 108 make up the upper conducting layer.

As shown by comparing FIGS. 2 and 3, it can be seen that because of the CMP of step S85, the height of layer 106 was reduced down to the height of protruding surface area 150. However, protruding surface area 150 and the portion of layer 104 extending over the protruding surface area is not substantially affected by the CMP of step S85.

As shown in FIG. 3, the scribing of step S95 causes scribing gap 154 in upper conducting layer 107, 108, which divides sub-layers 107 and 108 into sub-cell structures 107a,

107b, 108a and 108b. In this embodiment, gap 154 exposes a part of layer 104b to separate the sub-cells. In this embodiment, the upper conducting layer of the first sub-cell 108a contacts the lower conducting layer of the second sub-cell 104b to provide the monolithic series connection of the sub-cells to achieve a higher module voltage. Alternatively, in other embodiments, the sub-cells could be completely electrically isolated from each other.

II. Further Comments and/or Embodiment(s)

According to some embodiments of the present disclosure, a process for making e/m radiation cells (for example, solar cells) includes one or more of the following: (i) use of a substrate with protruded areas; and/or (ii) replacing at least a portion of the scribing operations (for example, the P2 scribe of the absorber) by chemical mechanical polishing (CMP) operation(s). A method for segmenting thin film solar cells will now be discussed. Thin film solar cells usually require segmentation into sub-cells in order to optimize cell performance in terms of voltage and current. The segments are electrically reconnected again, usually in a monolithic way without further added interconnection wiring. A method embodiment of the present disclosure includes the following operations: (i) provide a substrate; (ii) scribe the conducting back contact layer (also referred to as the P1 scribe); (iii) perform absorber-related CMP; (iv) scribe the transparent conducting oxide (also referred to as the P3 scribe); and (v) edge scribe (also referred to as the P4 scribe). Some embodiments of this process: (i) reduce or eliminate defects in the active semiconducting layers; and (ii) reduce or eliminate the dead area in between sub-cells. Some embodiments of the present disclosure target CIGS (copper indium gallium selenide) solar cells, but other embodiments are more broadly directed to: (i) any thin film solar cells that has sub-cells; and/or (ii) any thin film e/m radiation cell that has sub-cells.

As mentioned above, some embodiments of this disclosure apply chemical mechanical polishing methods in order to separate sub-cells. In these embodiments, layers are: (i) deposited onto dimples (that is protrusions made by making dimples in the substrate); or, alternatively or additionally, (ii) a flat substrate is modified by small humps (or protrusions). In these embodiments, an e/m-voltaic (such as a photovoltaic layer) active layer (also called the thin film) is deposited in and/or on both: (i) the protrusions, and (ii) the flat portion of the substrate. Active layer material above the protrusions is removed by chemical mechanical polishing. This removal of the protruded areas leaves separate segments of thin film material as deposited photovoltaic material such that the thin film is divided into sub-cell structures. Some embodiments of the present disclosure provide a new method, employing chemical mechanical polishing to separate sub-cells reducing the defects generated by scribing. The present disclosure recognizes that there is a need to improve the current scribing process for thin film solar cells, especially for CIGS (copper indium gallium selenide) active layer, CZTS (copper zinc tin sulfide) active layer, or CdTe (cadmium telluride) active layer solar cells.

Thin film solar cells are photovoltaic devices manufactured by deposition of a thin film of the absorber material onto large substrates, for example glass plates the size of window panes. After deposition of the absorber and the formation of a suitable photovoltaic junction, the film would appear as a single diode with a voltage related to the internal bandgap of the semiconducting material and the electrical properties of the network, much like a silicon wafer with added contact grid but with larger dimensions. In this case the voltage would be a fraction of a volt. If the module is able to deliver a power in the range of 60 to 100 watts, then relatively large currents result. In many applications, a higher voltage and lower current is beneficial, because this reduces ohmic losses in series resistance. The transparent conducting oxide (TCO) which is used as a front window contact material is far from being ideal as a conductor. For this reason, the large absorber is cut into segments and the segments are interconnected again. This interconnection is done via soldered stripes for silicon wafers but needs to be done in a different way for thin film solar cells. Fortunately, a monolithic approach is possible, segmenting the different films and interconnecting them again via deposition of thin films. In that case, no wiring or soldering is required for thin film solar cells. Moreover, no contact grid deposition is required.

A process embodiment of the present disclosure is as follows: (i) provide substrate with protruded surface areas, for example in stripes; (ii) deposit backside contacting layer; (iii) scribe backside contacting layer; (iv) deposit absorber; (v) chemical mechanical polishing of the surface and recess to level of protrusion, exposing the backside conducting layer; (vi) deposit frontside transparent conducting layer; (vii) scribe front side transparent conducting layer; and (viii) module fabrication. The method is quite general and not limited to a particular material system and can be applied to any thin film semiconducting thin film for singulation and series connection. The CMP scribing method can also be applied for roll-to-roll manufacturing of thin film solar cells and also on polymeric / metal sheet substrates.

Some embodiments of the present invention may have one, or more, of the following features, characteristics and/or advantages: (i) increases the module efficiency relative to panels that exclusively use scribing to separate sub-cells; (ii) prevent damage to the absorber layer; and/or (iii) separate the absorber without damaging the material by inducing defects or changing its phase state through heating, etc.

In some embodiments of the present disclosure, in order to apply CMP to thin film solar cells for separation into sub-cells, substrate topography is modified. This modification can be achieved by etching or deposition methods. In one embodiment, the active layer(s) are deposited into dimples in the substrate. In another embodiment, a flat substrate is modified by deposition of small humps, creating a similar shaped surface topography. In either type of embodiment, the active layer(s) cover substantially the entire substrate, including its flat, planar areas and also its dimples (that is, a protrusion made by dimpling) / humps (collectively called protrusions). The protruded areas are then removed by chemical mechanical polishing. This leaves separate flat, planar, mutually isolated sub-sell segments of the active layer(s).

III. Definitions

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: non-exclusive or; for example, A and/or B means that: (i) A is true and B is false; or (ii) A is false and B is true; or (iii) A and B are both true.

Electrically Connected: means either directly electrically connected, or indirectly electrically connected, such that intervening elements are present; in an indirect electrical connection, the intervening elements may include inductors and/or transformers.

Mechanically connected: Includes both direct mechanical connections, and indirect mechanical connections made through intermediate components; includes rigid mechanical connections as well as mechanical connection that allows for relative motion between the mechanically connected components; includes, but is not limited, to welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

Over: if thing A is "over" thing B, then this should not be taken to necessarily imply that thing A and thing B are in contact.

Layer: a single layer or a set of consecutive layers that acts as a single layer; for example, an active layer may be a single layer, or a set of discrete and consecutive layers that transduce electromagnetic radiation into electricity; as another example, a conductive layer may include multiple discrete layers, but still herein be referred to as a singular "layer."

Polishing: CMP and/or pure mechanical polishing.

What is claimed is:

1. A process for making an electromagnetic radiation cell comprising:
providing a substrate having an upper surface with at least one protrusion, the at least one protrusion including two upstanding opposed lateral surfaces;
forming a lower conducting layer on the upper surface of the substrate;
removing a portion of the lower conducting layer to form first and second sub-cell portions of the lower conducting layer, the first and second sub-cell portions of the lower conducting layer being separated by the removed portion, the second sub-cell portion of the lower conductive layer extending continuously over both the two upstanding opposed lateral surfaces of the at least one protrusion;
forming an active layer on top of the first and second sub-cell portions of the lower conducting layer and filling the removed portion of the lower conducting layer, the active layer having first and second planar portions and a discontinuity portion over the at least one protrusion; and
removing a portion discontinuity portion of the active layer to form first and second sub-cell portions of the active layer, the first and second sub-cell portions of the active layer being separated by a portion of the protrusion;
wherein, the first and second sub-cell portions of the lower conducting layer and the first and second sub-cell portions of the active layer form first and second sub-cells, respectively.

2. The process of claim 1 wherein the active layer is photovoltaic.

3. The process of claim 1 wherein the removing of a portion of the discontinuity portion of the active layer includes chemical-mechanical polishing.

* * * * *